US010626285B2

(12) United States Patent
Domingues Dos Santos et al.

(10) Patent No.: US 10,626,285 B2
(45) Date of Patent: Apr. 21, 2020

(54) COMPOSITION BASED ON ELECTROACTIVE TERPOLYMER

(71) Applicants: ARKEMA FRANCE, Colombes (FR); INSTITUT NATIONAL DES SCIENCES APPLIQUEES DE LYON, Villeurbanne (FR)

(72) Inventors: Fabrice Domingues Dos Santos, Paris (FR); Thierry Lannuzel, Villeurbanne (FR); Jean-Fabien Capsal, Venissieux (FR); Pierre-Jean Cottinet, Limas (FR); Jeremy Galineau, Villeurbanne (FR); Minh-Quyen Le, Limas (FR)

(73) Assignees: ARKEMA FRANCE, Colombes (FR); INSTITUT NATIONAL DES SCIENCES APPLIQUEES DE LYON, Villeurbanne (FR)

( * ) Notice: Subject to any disclaimer, the term of this patent is extended or adjusted under 35 U.S.C. 154(b) by 79 days.

(21) Appl. No.: 15/543,310

(22) PCT Filed: Jan. 11, 2016

(86) PCT No.: PCT/FR2016/050042
§ 371 (c)(1),
(2) Date: Jul. 13, 2017

(87) PCT Pub. No.: WO2016/113492
PCT Pub. Date: Jul. 21, 2016

(65) Prior Publication Data
US 2017/0355870 A1 Dec. 14, 2017

(30) Foreign Application Priority Data

Jan. 14, 2015 (FR) ..................... 15 50291

(51) Int. Cl.
*C09D 127/16* (2006.01)
*C08F 214/22* (2006.01)
*C08F 214/24* (2006.01)
*H01L 41/193* (2006.01)
*H01L 41/317* (2013.01)
*C08L 27/16* (2006.01)
*C08F 214/18* (2006.01)

(52) U.S. Cl.
CPC .......... *C09D 127/16* (2013.01); *C08F 214/18* (2013.01); *C08F 214/22* (2013.01); *C08F 214/24* (2013.01); *C08L 27/16* (2013.01); *H01L 41/193* (2013.01); *H01L 41/317* (2013.01); *C08L 2205/025* (2013.01); *C08L 2205/03* (2013.01)

(58) Field of Classification Search
CPC ..... C09D 127/16; C08L 27/16; C08F 214/22; H01L 41/193
See application file for complete search history.

(56) References Cited

U.S. PATENT DOCUMENTS

| | | | |
|---|---|---|---|
| 3,541,039 A | 11/1970 | Whiton | |
| 6,843,948 B2 | 1/2005 | Ohira et al. | |
| 2002/0146567 A1* | 10/2002 | Zhang | .................. C08F 214/22 428/421 |
| 2008/0284277 A1* | 11/2008 | Kwon | ................. H01L 41/0471 310/309 |
| 2012/0178880 A1 | 7/2012 | Zhang et al. | |
| 2012/0248945 A1 | 10/2012 | Koo et al. | |
| 2015/0287906 A1 | 10/2015 | Zhang et al. | |

FOREIGN PATENT DOCUMENTS

| | | |
|---|---|---|
| JP | 9208784 A | 8/1997 |
| JP | 2014043514 A | 3/2014 |
| WO | 2011008940 A1 | 1/2011 |

OTHER PUBLICATIONS

Polymer Properties Database, Glass Transition Temperatures; retrieved Jan. 28, 2019 from polymerdatabase.com (Year: 2015).*
International Search Report dated Mar. 11, 2016 issued in corresponding PCT/FR2016/050042 application (3 pages).
J-F Capsal et al., "Plasticized Relaxor Ferroelectric Terpolymer: Toward Giant Electrostriction, High Mechanical Energy and Low Electric Field Actuators", Sensors and Actuators A: Physical, vol. 207 (2014) pp. 25-31.
K.J. Kim et al., "Miscibility, Phase Behavior, and Curie Transition in Blends of Vinylidene Fluoride/Trifluoroethylene Copolymer and Poly(1,4-butylene adipate)", Polymer, vol. 40, No. 22 (1999) pp. 6125-6134.
First official action in corresponding Japanese Patent Application No. 2017-537480 dated Aug. 13, 2019 (pp. 1-6).

* cited by examiner

Primary Examiner — Ramsey Zacharia
(74) Attorney, Agent, or Firm — Millen, White, Zelano and Branigan, P.C.

(57) ABSTRACT

The invention relates to a composition comprising at least one electroactive fluorinated terpolymer, and at least one second polymer compatible with the electroactive fluorinated terpolymer and having a glass transition temperature lower than that of the electroactive fluorinated terpolymer. The invention also relates to a method for producing said composition, and to a device such as an actuator comprising a substrate and a film of the above-mentioned composition.

19 Claims, No Drawings

COMPOSITION BASED ON ELECTROACTIVE TERPOLYMER

FIELD OF THE INVENTION

The present invention relates to a composition obtained by mixing an electroactive fluoroterpolymer and a polymer compatible with the electroactive fluoroterpolymer and exhibiting a glass transition temperature lower than that of the electroactive fluoroterpolymer. The invention also relates to the process for the manufacture of this composition.

TECHNICAL BACKGROUND

Fluoropolymers represent a class of compounds having noteworthy properties for a large number of applications, from painting or special coatings to sealing joints, via optics, microelectronics and membrane technology. Among these fluoropolymers, copolymers are particularly advantageous due to their diversity, their morphology, their exceptional properties and their versatility.

Electroactive fluoroterpolymers, generally used in the form of films, of deposits or of stacks, combined with electrodes, have noteworthy electromechanical properties. They have a high electromechanical energy density. Thus, when devices comprising such terpolymers are subjected to an electric field, they become strained, which makes possible the production of actuators.

The document U.S. Pat. No. 6,787,238 describe the preparation of terpolymers according to a method for the polymerization of a mixture of three monomers comprising a vinylidene fluoride (VDF) monomer, a monomer such as tetrafluoroethylene (TFE) or trifluoroethylene (TrFE) and a monomer such as tetrafluoroethylene (TFE), vinyl fluoride, perfluoro(methyl vinyl ether), bromotrifluoroethylene, chlorofluoroethylene, chlorotrifluoroethylene (CTFE) and hexafluoropropylene (HFP).

The document U.S. Pat. No. 6,355,479 describes the preparation of terpolymers of vinylidene fluoride, of trifluoroethylene and of a comonomer, such as CTFE or HFP, according to a copolymerization process controlled by means of borane compounds in the presence of oxygen.

The document U.S. Pat. No. 5,087,679 describes the preparation of a dielectric terpolymer which comprises vinylidene fluoride, trifluoroethylene and chlorotrifluoroethylene.

The document U.S. Pat. No. 4,554,335 describes a dielectric polymer material composed of vinylidene fluoride, of trifluoroethylene, of chlorotrifluoroethylene and of another fluorine-containing monomer.

The paper *High Electromechanical Responses in a Poly (vinylidene fluoride-trifluoroethylene-chlorofluoroethylene) Terpolymer* by Xia et al., published in *Advanced Materials*, 14, 1574-1577 (2002), shows the importance of a third monomer for influencing the microstructure of the copolymer of vinylidene fluoride and of trifluoroethylene.

The paper *Influencing dielectric properties of relaxor polymer system by blending vinylidene fluoride-trifluoroethylene-based terpolymer with a ferroelectric copolymer* by Casar et al. in *Journal of Applied Physics*, 115,104101 (2014), describes the mixture of a relaxor terpolymer P(VDF-TrFE-CFE) and of a ferroelectric polymer P(VDF-TrFE).

Likewise, the paper *A polymer blend approach to tailor the ferroelectric reponses in P(VDF-TrFE) based copolymers* by Chen et al. in *Polymer*, 54, 2373-2381 (2013), also describes the mixture of a terpolymer and of a copolymer.

The document WO 2011/008940 describes the mixture of a terpolymer and of another fluoropolymer. The document EP 0 206 926 describes mixtures of fluoropolymers or fluorocopolymers.

Finally, the document WO 2014/170479 describes mixtures of a terpolymer P(VDF-TrFE-CFE) or P(VDF-TrFE-CTFE) with a plasticizer of phthalate type, and their use to manufacture films and actuators. It is set out that these mixtures exhibit an improved dielectric permittivity.

However, these mixtures exhibit a poor ecotoxicological profile, the phthalate plasticizer used being toxic. Furthermore, the present inventors have found that the phthalate plasticizer exhibits a tendency toward release (or sweating), which represents a risk for the health, makes difficult the deposition of electrodes and can result in a significant deterioration in the mechanical properties of the films obtained.

There thus exists a need to develop a composition which exhibits good electromechanical properties (in particular for use in actuators), which has a satisfactory ecotoxicological profile and which does not exhibit a risk of release.

SUMMARY OF THE INVENTION

The invention relates first to a composition comprising:
at least one electroactive fluoroterpolymer, and
at least one second polymer compatible with the electroactive fluoroterpolymer and exhibiting a glass transition temperature lower than that of the electroactive fluoroterpolymer.

According to one embodiment, the second polymer exhibits a glass transition temperature lower by at least 5° C., preferably by at least 10° C., or by at least 15° C., or by at least 20° C., than that of the electroactive fluoroterpolymer.

According to one embodiment, the glass transition temperature of the electroactive fluoroterpolymer has a value of −50° C. to +10° C., preferably of −40° C. to −10° C.; and/or the glass transition temperature of the second polymer has a value of −100° C. to 0° C., preferably of −100° C. to −40° C.

According to one embodiment, the electroactive fluoroterpolymer is a terpolymer of vinylidene fluoride, of trifluoroethylene and of a third monomer.

According to one embodiment, the third monomer is 1-chloro-1-fluoroethylene or chlorotrifluoroethylene.

According to one embodiment, the second polymer is a polyester preferably chosen from polyadipates, polyglutarates and polysebacates.

According to one embodiment, the electroactive fluoroterpolymer and the second polymer are present in a ratio by weight of 50:50 to 99:1, preferably of 70:30 to 95:5 and more particularly preferably of 80:20 to 90:10.

According to one embodiment, the composition comprises at least one solvent preferably chosen from tetrahydrofuran, methyl ethyl ketone, dimethylformamide, dimethylacetamide, tetramethylurea, dimethyl sulfoxide, trimethyl phosphate, N-methyl-2-pyrrolidone, acetone, methyl isobutyl ketone, glycol ethers, glycol ether esters, n-butyl acetate, cyclohexanone, diacetone alcohol, diisobutyl ketone, ethyl acetoacetate, butyrolactone, isophorone, triethyl phosphate, carbitol acetate, propylene carbonate and glyceryl triacetate.

According to one embodiment:

the electroactive fluoroterpolymer exhibits a molecular weight of 200 000 to 1 500 000, preferably of 250 000 to 1 000 000 and more particularly of 300 000 to 700 000; and/or the second polymer exhibits a molecular weight of 500 to 700 000, preferably of 2000 to 100 000 and more particularly of 5000 to 20 000.

According to one embodiment, the composition also comprises a fluorocopolymer, in particular a ferroelectric fluorocopolymer, preferably chosen from copolymers of vinylidene fluoride and of trifluoroethylene, of vinylidene fluoride and of chlorotrifluoroethylene, of vinylidene fluoride and of tetrafluoroethylene, and of vinylidene fluoride and of hexafluoropropylene.

The invention also relates to a process for the manufacture of a composition as described above, comprising a stage of mixing the electroactive fluoroterpolymer with the second polymer.

According to one embodiment, the mixing is carried out in a solvent preferably chosen from tetrahydrofuran, methyl ethyl ketone, dimethylformamide, dimethylacetamide, tetramethylurea, dimethyl sulfoxide, trimethyl phosphate, N-methyl-2-pyrrolidone, acetone, methyl isobutyl ketone, glycol ethers, glycol ether esters, n-butyl acetate, cyclohexanone, diacetone alcohol, diisobutyl ketone, ethyl acetoacetate, butyrolactone, isophorone, triethyl phosphate, carbitol acetate, propylene carbonate and glyceryl triacetate, preferably by dissolving the electroactive fluoroterpolymer and then the second polymer in the solvent.

The invention also relates to a device comprising a substrate and a film of the composition described above deposited on the substrate.

According to one embodiment, the device additionally comprises electrodes on either side of the film, said device preferably being an actuator.

The invention also relates to a process for the manufacture of the above device, comprising a stage of deposition of the film on the substrate.

According to one embodiment, the stage of the deposition is a stage of coating or printing the composition on the substrate.

According to one embodiment, the manufacturing process comprises an additional stage of deposition of electrodes, preferably by evaporation or sputtering of metal, indium tin oxide, a layer of conductive polymer, conductive ink based on silver, silver nanowires, or graphene.

The present invention makes it possible to overcome the disadvantages of the state of the art. It more particularly provides a composition which exhibits good electromechanical properties (in particular for use in actuators), which has a satisfactory ecotoxicological profile and which does not exhibit a risk of release.

This is accomplished by virtue of the combination between an electroactive fluoroterpolymer and a second polymer compatible with the terpolymer, exhibiting a glass transition temperature lower than that of the terpolymer.

The present inventors have discovered that this combination makes it possible to obtain electromechanical properties which are considerably improved (greater strain under electric field, electromechanical properties extended over a broad temperature range) with respect of those of the terpolymer alone, while preventing the problems of toxicity and of release encountered when plasticizers of phthalate type are used. The mechanical properties (in particular the modulus of elasticity) are not detrimentally affected either, with respect to the terpolymers alone.

In particular, the composition of the invention offers an ease of processing, in particular during the manufacture of multilayer deposits or films, as a result of the absence of compound release.

It is particularly appropriate for the manufacture of actuators.

DESCRIPTION OF EMBODIMENTS OF THE INVENTION

The invention is now described in greater detail and in a nonlimiting manner in the description which follows.

The invention is based first on the use of an electroactive fluoroterpolymer. The term "fluoro" is understood to mean a terpolymer comprising —F groups. The term "electroactive" is understood to mean a terpolymer capable of being strained under the effect of an electric field.

Preferably, the fluoroterpolymer is a relaxor ferroelectric polymer. Such a material exhibits a weak coercive field (typically of less than 10 V/µm) and a weak (typically of less than 10 mC/m$^2$), indeed even zero, remanent polarization.

Preferably, the terpolymer comprises vinylidene fluoride units.

Preferably again, the terpolymer is of formula P(VDF-TrFE-X), where VDF represents vinylidene fluoride units, TrFE represents trifluoroethylene units and X represents units resulting from a third monomer, preferably a third fluoromonomer. More particularly preferably, X represents units resulting from CFE (1-chloro-1-fluoroethylene) or from CTFE (chlorotrifluoroethylene).

Alternatively, the third monomer can in particular be chosen from halogenated alkenes, in particular halogenated propenes or ethylenes, and for example from tetrafluoropropenes (in particular 2,3,3,3-tetrafluoropropene), chlorotrifluoropropenes (in particular 2-chloro-3,3,3-trifluoropropene), 1-chloro-2-fluoroethylene, trifluoropropenes (in particular 3,3,3-trifluoropropene), pentafluoropropenes (in particular 1,1,3,3,3-pentafluoropropene or 1,2,3,3,3-pentafluoropropene), 1-chloro-2,2-difluoroethylene, 1-chloro-2-fluoroethylene, 1-bromo-2,2-difluoroethylene, bromotrifluoroethylene, fluoroethylene (or vinyl fluoride), tetrafluoroethylene and hexafluoropropene. The third monomer can also be a perfluoroalkyl vinyl ether, of general formula $R_f$—O—CF=CF$_2$, $R_f$ being a preferably $C_1$ to $C_4$ alkyl group. Preferred examples are PPVE (perfluoropropyl vinyl ether) and PMVE (perfluoromethyl vinyl ether).

The terpolymers of the invention can be produced by using any known process, such as emulsion polymerization, suspension polymerization and solution polymerization. The use of the process described in the document WO 2010/116105 is particularly preferred. This process makes it possible to obtain polymers of high molecular weight and of appropriate structuring.

According to one embodiment, the molar proportion of X units in the terpolymer has a value of 2 to 15%, preferably of 3 to 12% and more particularly preferably of 5 to 10%.

According to one embodiment, the molar ratio of the VDF units to the TrFE units in the terpolymer has a value of 80/20 to 50/50 and preferably of 72/28 to 60/40.

According to one embodiment, the weight-average molar mass, which in the context of this patent application is also denoted by "molecular weight", (Mw) of the terpolymer has a value of 200 000 to 1 500 000, preferably of 250 000 to 1 000 000 and more particularly of 300 000 to 700 000.

The latter can be adjusted by modifying certain parameters of the process, such as the temperature in the reactor, or by adding a transfer agent.

The molecular weight distribution can be estimated by SEC (Size Exclusion Chromatography) with dimethylformamide (DMF) as eluent, with a set of 3 columns of increasing porosity. The stationary phase is a styrene-DVB gel. The detection method is based on a measurement of the refractive index, and the calibration is carried out with polystyrene standards. The sample is dissolved at 0.5 g/l in DMF and filtered through a 0.45 µm nylon filter.

The molecular weight can also be evaluated by measurement of the melt flow index at 230° C. under a load of 5 kg according to ASTM D1238 (ISO 1133).

Moreover, the molecular weight can also be characterized by a measurement of the viscosity in solution according to the standard ISO 1628. Methyl ethyl ketone (MEK) is a preferred solvent of the terpolymers for the determination of the viscosity index.

More generally, the molar composition of the terpolymers of the invention can be determined by various means. The conventional methods for elemental analysis of carbon, fluorine and chlorine or bromine elements result in a system of two or three independent equations having two independent unknowns (for example % VDF and % TrFE, with % X=100−(% VDF+% TrFE)), which makes it possible to unambiguously calculate the composition by weight of the polymers, from which the molar composition is deduced.

Use may also be made of multinuclear, in this instance proton ($^1$H) and fluorine ($^{19}$F), NMR techniques, by analysis of a solution of the polymer in an appropriate deuterated solvent. The NMR spectrum is recorded on an FT-NMR spectrometer fitted with a multinuclear probe. The specific signals given by the different monomers in the spectra produced according to one or other nucleus are then located. Thus, for example, the TrFE (CFH=CF$_2$) unit gives, in proton NMR, a specific signal characteristic of the CFH group (at approximately 5 ppm). It is the same for the CH$_2$ groups of the VDF (broad unresolved peak centred at 3 ppm). The relative integration of the two signals gives the relative abundance of the two monomers, that is to say the VDF/TrFE molar ratio.

The combination of the relative integrations of the different signals obtained in proton NMR and in fluorine NMR results in a system of equations, the resolution of which results in the molar concentrations of the different monomer units being obtained.

Finally, it is possible to combine the elemental analysis, for example for the heteroatoms, such as chlorine or bromine, and the NMR analysis. Thus, the content of CTFE or of CFE can be determined by a measurement of the chlorine content by elemental analysis.

A person skilled in the art thus has available a palette of methods or of combinations of methods allowing him to determine, without ambiguity and with the necessary accuracy, the composition of the terpolymers of the invention.

The invention is subsequently based on the use of a second polymer, compatible with the terpolymer and exhibiting a glass transition temperature lower than that of the terpolymer.

The term "compatible" is understood to mean that the mixture of the two polymers forms a homogeneous phase with a single glass transition temperature.

The glass transition temperature of the polymers of the invention can be measured by differential scanning calorimetry, for example according to the standard ASTM E1356.

Thus, preferably, the glass transition temperature of the second polymer is lower by at least 5° C., or by at least 10° C., or by at least 15° C., or by at least 20° C., than the glass transition temperature of the terpolymer.

According to one embodiment, the glass transition temperature of the terpolymer can have a value from 10 to −50° C., preferably from 0 to −40° C. and more particularly from −10 to −40° C. (for example approximately −20° C.).

According to one embodiment, the glass transition temperature of the second polymer can be less than −20° C., preferably less than −30° C. and more particularly less than −40° C. For example, it can have a value from −100° C. to 0° C., preferably from −100° C. to −40° C.

Preferably, the second polymer comprises a single glass transition temperature.

Preferably, the second polymer is not a block copolymer or a graft copolymer.

Preferably, it is either a homopolymer or a copolymer having a homogeneous structure, in which the monomer units are distributed periodically, randomly or statistically.

Preferably, the second polymer is not fluorinated.

Preferably, the second polymer is not a ferroelectric polymer.

Preferably, the second polymer is not an electroactive polymer.

Preferably, the second polymer is a polar polymer.

Preferably, the second polymer is a noncrystalline polymer. The polymers for which a differential scanning calorimetry measurement reveals an endothermic phenomenon comparable to an enthalpy of fusion of less than 5 J/g can be regarded as noncrystalline polymers.

The second polymer can in particular be a polyester. It is preferably a polyadipate, a polyglutarate or a polysebacate.

The molecular weight of the second polymer is preferably greater than or equal to 500, or 2000 or 5000. It is preferably less than or equal to 700 000 and more particularly less than or equal to 20 000.

The composition of the invention comprises at least one terpolymer as described above (optionally two or more of them) and at least one second polymer as described above (optionally two or more of them).

This composition can also comprise a solvent (in which case it can be a composition suitable for being deposited on a substrate, for example). Alternatively, it can be devoid of solvent (it being possible for such a composition, for example, to be obtained from the preceding one by evaporation of the solvent, for example after deposition on a substrate).

Use may in particular be made, as appropriate solvent, of tetrahydrofuran, methyl ethyl ketone, dimethylformamide, dimethylacetamide, tetramethylurea, dimethyl sulfoxide, trimethyl phosphate, N-methyl-2-pyrrolidone, acetone, methyl isobutyl ketone, glycol ethers, glycol ether esters, n-butyl acetate, cyclohexanone, diacetone alcohol, diisobutyl ketone, ethyl acetoacetate, butyrolactone, isophorone, triethyl phosphate, carbitol acetate, propylene carbonate and glyceryl triacetate.

The composition of the invention can also comprise one or more additional polymers, such as ferroelectric fluorocopolymers (for example P(VDF-TrFE)) or non-ferroelectric fluorocopolymers (for example P(VDF-CTFE), P(VDF-HFP)).

The composition of the invention can also comprise one or more additives, chosen in particular from plasticizers, salts and flame retardants.

Preferably, the composition according to the invention is devoid of compound of phthalate type.

The electroactive fluoroterpolymer and the second polymer are advantageously present in a terpolymer:second polymer ratio by weight of 50:50 to 99:1, preferably of 70:30 to 95:5 and more particularly preferably of 80:20 to 90:10.

When the composition comprises a solvent, the latter can preferably be present in a proportion by weight of at least 50%, preferably of at least 80%, more particularly preferably of at least 95%, indeed even of at least 99%.

The composition of the invention can be manufactured by dissolving its different compounds in a solvent (in particular as described above). It is preferred to dissolve the terpolymer in the solvent before the second polymer. Optionally, the solvent can subsequently be evaporated.

Alternatively, the composition can be manufactured by the molten route, in the absence of solvent.

The invention provides in particular films manufactured from compositions according to the invention and deposited on a substrate. The substrate can, for example, be a polymeric substrate, such as a poly(ethylene terephthalate) or polyethylene naphthalate substrate, or else a substrate of paper, of glass or of silicon.

Preferably, the film is deposited by the solvent or molten route, then dried and annealed in order to crystallize it (by heating at a temperature lower than the melting point of the composition, for a period of time of greater than or equal to 1 minute).

The invention also provides multilayer structures, comprising at least one film with the composition of the invention and electrodes on either side.

Such structures can in particular be produced:
- by coating the composition on a substrate, evaporation of the solvent, annealing and deposition of electrodes by evaporation or sputtering of metal deposit, indium tin oxide (ITO), deposition of a layer of conductive polymer, deposition of a conductive layer starting from conductive inks based on silver, silver nanowires, or graphene, and the like; or else
- by printing the composition on a substrate, for example by screen printing, photogravure, offset printing, and the like, and then annealing and deposition of electrodes by evaporation or sputtering of metal deposit, indium tin oxide (ITO), deposition of a layer of conductive polymer, deposition of a conductive layer starting from conductive inks based on silver, silver nanowires, and the like.

These multilayer structures can thus provide actuators.

Other objects which can be produced by virtue of the compositions of the invention comprise fibers, filaments, cables and multicomponent fibers, including a central conductive core, which are produced by the solvent route or by extrusion.

EXAMPLES

The following examples illustrate the invention without limiting it.

In order to characterize the electromechanical properties of the polymers, 15% by weight of electroactive polymer(s) are dissolved in methyl ethyl ketone, in a heated round-bottomed flask surmounted by a condenser column. The mixing is carried out under reflux at 80° C., with magnetic stirring. After complete dissolution, the solution is filtered through a 1 μm filter. The solution is subsequently deposited under a controlled atmosphere, by coating, on a glass sheet. The solvent is allowed to evaporate for 12 hours. The films obtained are subsequently brought to 80° C. in an oven in order to remove the traces of solvent. The films are subsequently annealed at 115° C. for 1 hour.

Films are subsequently placed at ambient temperature; the release of volatile compounds is examined visually and by touch after 12 hours.

Films are covered with electrodes by evaporation under vacuum of gold. Their dielectric properties are measured by impedance spectroscopy. Their mechanical properties are measured by dynamic mechanical analysis.

In order to measure the electromechanical properties, the electrode-possessing films are attached to 100-μm flexible polyethylene terephthalate substrates using an adhesive (Scotch 3M ATG 924). The multilayers thus produced are subsequently laminated for 15 minutes using a D&K 4468H laminator. The films are subsequently attached to supports. Each film face is connected to a pole of a variable voltage generator (Trek 609D-6).

When the sample is subjected to a voltage, its deflection is measured using a laser strain sensor (Baumer CH-8501). The longitudinal strain of the polymer film $S_{31}$ (E) is calculated from the mechanical properties of the different layers and from the geometry of the samples.

In example 1, the polymer used is a P(VDF-TrFE-CTFE) terpolymer with the molar composition 61.0/30.1/8.9.

Example 2 is similar to example 1, apart from the fact that, at the end of the dissolution of the polymer, 15% by weight, with respect to the polymer, of noncrystalline polar polymer of polyester type (Palamoll 652/BASF) are added.

In example 3, the procedure is as for example 1 but, at the end of the dissolution of the polymer, 15% by weight, with respect to the polymer, of nonpolymeric diethylhexyl phthalate plasticizer are added.

This plasticizer is categorized as carcinogenic, mutagenic and reprotoxic.

|  | $S_{31}$ (10 V/μm) % | Release after 12 h | Ecotoxicological profile |
|---|---|---|---|
| Example 1 (comparative) | 0.0025 | None | Good |
| Example 2 (invention) | 0.2 | None | Good |
| Example 3 (comparative) | 0.4 | High | Poor |

It is found that the example corresponding to the invention makes it possible to obtain release-free films and devices having a good ecotoxicological profile and having improved low-field electromechanical properties.

The invention claimed is:

1. A composition comprising:
   at least one electroactive fluoroterpolymer, and
   at least one second polymer compatible with the electroactive fluoroterpolymer and exhibiting a glass transition temperature lower than that of the electroactive fluoroterpolymer, wherein the second polymer is a polyester.

2. The composition as claimed in claim 1, in which the second polymer exhibits a glass transition temperature lower by at least 5° C. than that of the electroactive fluoroterpolymer.

3. The composition as claimed in claim 1, in which the glass transition temperature of the electroactive fluoroterpolymer has a value of −50° C. to +10° C., and/or the glass transition temperature of the second polymer has a value of −100° C. to 0° C.

4. The composition as claimed in claim 1, in which the electroactive fluoroterpolymer is a terpolymer of vinylidene fluoride, of trifluoroethylene and of a third monomer.

5. The composition as claimed in claim 4, in which the third monomer is 1-chloro-1-fluoroethylene or chlorotrifluoroethylene.

6. The composition as claimed in claim 1, in which the electroactive fluoroterpolymer and the second polymer are present in a ratio by weight of 50:50 to 99:1.

7. The composition as claimed in claim 1, comprising at least one solvent that is tetrahydrofuran, methyl ethyl ketone, dimethylformamide, dimethylacetamide, tetramethylurea, dimethyl sulfoxide, trimethyl phosphate, N-methyl-2-pyrrolidone, acetone, methyl isobutyl ketone, glycol ethers, glycol ether esters, n-butyl acetate, cyclohexanone, diacetone alcohol, diisobutyl ketone, ethyl acetoacetate, butyrolactone, isophorone, triethyl phosphate, carbitol acetate, propylene carbonate or glyceryl triacetate.

8. The composition as claimed in claim 1, in which:
the electroactive fluoroterpolymer exhibits a molecular weight of 200 000 to 1 500 000 and/or
the second polymer exhibits a molecular weight of 500 to 700 000.

9. The composition as claimed in claim 1, also comprising a fluorocopolymer.

10. The composition according to claim 9, wherein the fluorocopolymer is a ferroelectric fluorocopolymer that is a copolymer of vinylidene fluoride and of trifluoroethylene, of vinylidene fluoride and of chlorotrifluoroethylene, of vinylidene fluoride and of tetrafluoroethylene, or of vinylidene fluoride and hexafluoropropylene.

11. The composition as claimed in claim 1, in which the electroactive fluoroterpolymer is a relaxor terpolymer.

12. The composition according to claim 1, wherein the polyester is a polyadipate, polyglutarate or polysebacate.

13. A process for the manufacture of a composition as claimed in claim 1, comprising a stage of mixing the electroactive fluoroterpolymer with the second polymer.

14. The manufacturing process as claimed in claim 13, in which the mixing is carried out in a solvent that is tetrahydrofuran, methyl ethyl ketone, dimethylformamide, dimethylacetamide, tetramethylurea, dimethyl sulfoxide, trimethyl phosphate, N-methyl-2-pyrrolidone, acetone, methyl isobutyl ketone, glycol ethers, glycol ether esters, n-butyl acetate, cyclohexanone, diacetone alcohol, diisobutyl ketone, ethyl acetoacetate, butyrolactone, isophorone, triethyl phosphate, carbitol acetate, propylene carbonate or glyceryl triacetate, by dissolving the electroactive fluoroterpolymer and then the second polymer in the solvent.

15. A device comprising a substrate and a film of the composition as claimed in claim 1 deposited on the substrate.

16. The device as claimed in claim 15, additionally comprising electrodes on either side of the film, said device being an actuator.

17. A process for the manufacture of the device as claimed in claim 15, comprising a stage of deposition of the film on the substrate.

18. The process for the manufacture of the device as claimed in claim 17, in which the stage of the deposition is a stage of coating or printing the composition on the substrate.

19. The process for the manufacture of the device as claimed in claim 17, comprising an additional stage of deposition of electrodes by evaporation or sputtering of metal or indium tin oxide, deposition of a layer of conductive polymer, or deposition of conductive ink based on silver, on silver nanowires, or on graphene.

* * * * *